(12) United States Patent
Kumar et al.

(10) Patent No.: US 12,712,016 B2
(45) Date of Patent: Aug. 18, 2026

(54) BIT LINE ACCUMULATION READOUT SCHEME FOR AN ANALOG IN-MEMORY COMPUTATION PROCESSING CIRCUIT

(71) Applicant: STMicroelectronics International N.V., Geneva (CH)

(72) Inventors: Promod Kumar, Greater Noida (IN); Kedar Janardan Dhori, Ghaziabad (IN); Harsh Rawat, Faridabad (IN); Nitin Chawla, Noida (IN); Manuj Ayodhyawasi, Noida (IN)

(73) Assignee: STMicroelectronics International N.V., Geneva (CH)

( * ) Notice: Subject to any disclaimer, the term of this patent is extended or adjusted under 35 U.S.C. 154(b) by 226 days.

(21) Appl. No.: 18/522,547

(22) Filed: Nov. 29, 2023

(65) Prior Publication Data

US 2024/0177769 A1 May 30, 2024

Related U.S. Application Data

(60) Provisional application No. 63/428,866, filed on Nov. 30, 2022.

(51) Int. Cl.

| | |
|---|---|
| ***G11C 11/419*** | (2006.01) |
| ***G11C 5/14*** | (2006.01) |
| ***G11C 8/08*** | (2006.01) |

(52) U.S. Cl.
CPC ............ *G11C 11/419* (2013.01); *G11C 5/145* (2013.01); *G11C 8/08* (2013.01)

(58) Field of Classification Search
CPC ....... G11C 11/418; G11C 11/419; G11C 8/08; G11C 5/145
USPC .................................................. 365/189.011
See application file for complete search history.

(56) References Cited

U.S. PATENT DOCUMENTS

| | | | | |
|---|---|---|---|---|
| 7,808,827 | B2 | 10/2010 | Lee et al. | |
| 8,451,679 | B1 * | 5/2013 | Sharpe-Geisler | G11C 11/419 365/189.16 |
| 10,877,752 | B2 | 12/2020 | Chen et al. | |
| 11,048,434 | B2 | 6/2021 | Kumar et al. | |
| 11,061,646 | B2 | 7/2021 | Sumbul et al. | |
| 11,322,195 | B2 | 5/2022 | Sinangil | |
| 2014/0254260 | A1 * | 9/2014 | Hung | G11C 16/26 365/185.2 |

(Continued)

*Primary Examiner* — Sung Il Cho
(74) *Attorney, Agent, or Firm* — Crowe & Dunlevy LLC

(57) ABSTRACT

A memory array includes memory cells arranged in rows and columns where each row includes a word line connected to memory cells of the row and each column includes a bit line connected to memory cells of the column. Each memory cell stores a bit of weight data for an in-memory computation operation. A row controller circuit coupled to the word lines through drive circuits is configured to simultaneously actuate multiple word lines during the in-memory computation operation. A column processing circuit includes a discharge time sensing circuit for each column that generates an analog signal indicative of a time taken during the in-memory computation operation to discharge the bit line from a precharge voltage to a threshold voltage. The analog signals are converted to digital signal and a computation circuitry performs digital signal processing calculations on the digital signals to generate a decision output for the in-memory computation operation.

32 Claims, 9 Drawing Sheets

(56) References Cited

U.S. PATENT DOCUMENTS

| | | | | |
|---|---|---|---|---|
| 2019/0042160 | A1* | 2/2019 | Kumar | G06F 3/0659 |
| 2019/0043560 | A1* | 2/2019 | Sumbul | G11C 11/419 |
| 2021/0264243 | A1* | 8/2021 | Sarin | G06N 3/065 |
| 2024/0028884 | A1* | 1/2024 | Moran | G06N 3/065 |

* cited by examiner

BIT LINE ACCUMULATION READOUT SCHEME FOR AN ANALOG IN-MEMORY COMPUTATION PROCESSING CIRCUIT

CROSS-REFERENCE TO RELATED APPLICATIONS

This application claims priority to United States Provisional Application for Patent No. 63/428,866, filed Nov. 30, 2022, the disclosure of which is incorporated herein by reference.

TECHNICAL FIELD

Embodiments herein relate to an analog in-memory computation processing circuit and, in particular, to circuitry for bit line accumulation readout for an analog in-memory computation operation.

BACKGROUND

Reference is made to FIG. 1 which shows a schematic diagram of an analog in-memory computation circuit 10. The circuit 10 utilizes a memory circuit including an array 12 of memory cells 14 (for example, a static random access memory (SRAM) array formed by standard 6T SRAM memory cells) arranged in a matrix format having N rows and M columns. As an alternative, a standard 8T memory cell or another type of bitcell with a similar functionality and topology could instead be used. As a further alternative, a non-volatile memory (NVM) cell could instead be used. Each memory cell 14 is programmed to store a bit of a computational weight or kernel data for an in-memory compute operation. In this context, the in-memory compute operation is understood to be a form of a high dimensional Matrix Vector Multiplication (MVM) supporting multi-bit weights that are stored in multiple bit cells of the memory. The group of bit cells (in the case of a multibit weight) can be considered as a virtual synaptic element. Each bit of the computational weight has either a logic “1” or a logic “0” value.

Each memory cell 14 includes a word line WL and a pair of complementary bit lines BLT and BLC. The 8T-type SRAM cell would additionally include a read word line RWL and a read bit line RBL. The cells 14 in a common row of the matrix are connected to each other through a common word line WL (and through the common read word line RWL in the 8T-type implementation). The cells 14 in a common column of the matrix are connected to each other through a common pair of complementary bit lines BLT and BLC (and through the common read bit line RBL in the 8T-type implementation). Each word line WL, RWL is driven by a word line driver circuit 16 which may be implemented as a CMOS driver circuit (for example, a series connected p-channel and n-channel MOSFET transistor pair forming a logic inverter circuit). The word line signals applied to the word lines, and driven by the word line driver circuits 16, are generated from feature data input to the in-memory computation circuit 10 and controlled by a row controller circuit 18. The word line driver circuits 16 are typically coupled to receive a high supply voltage (Vdd) at a high supply node and are referenced to a low supply voltage (Gnd) at a low supply node. A column processing circuit 20 senses the analog signals on the pairs of complementary bit lines BLT and BLC (and/or on the read bit line RBL) for the M columns, converts the analog signals to digital signals using analog-to-digital converter circuitry, performs digital calculations on the digital signals using a digital signal processing circuit and generates a decision output for the in-memory compute operation.

Although not explicitly shown in FIG. 1, it will be understood that the circuit 10 further includes conventional row decode, column decode, and read-write circuits known to those skilled in the art for use in connection with writing bits of data (for example, the computational weight data) to, and reading bits of data from, the SRAM cells 14 of the memory array 12. This operation is referred to as a conventional memory access mode and is distinguished from the analog in-memory compute operation discussed above.

The row controller circuit 18 receives the feature data for the in-memory compute operation and in response thereto performs the function of selecting which ones of the word lines WL<0> to WL<N−1> (or read word lines RWL<0> to RWL<N−1>) are to be simultaneously accessed (or actuated) in parallel during an analog in-memory compute operation, and further functions to control application of pulsed signals to the word lines in accordance with that in-memory compute operation. FIG. 1 illustrates, by way of example only, the simultaneous actuation of all N word lines with the pulsed word line signals, it being understood that in-memory compute operations may instead utilize a simultaneous actuation of fewer than all rows of the SRAM array. The analog signals on a given pair of complementary bit lines BLT and BLC (or analog signal on the read bit line RBL in the 8T-type implementation) are dependent on the logic state of the bits of the computational weight stored in the memory cells 14 of the corresponding column and the width(s) of the pulsed word line signals applied to those memory cells 14.

The implementation illustrated in FIG. 1 shows an example in the form of a pulse width modulation (PWM) for the applied word line signals for the in-memory compute operation dependent on the received feature data. The use of PWM or period pulse modulation (PTM) for the applied word line signals is a common technique used for the in-memory compute operation based on the linearity of the vector for the multiply-accumulation (MAC) operation. The pulsed word line signal format can be further evolved as an encoded pulse train to manage block sparsity of the feature data of the in-memory compute operation. It is accordingly recognized that an arbitrary set of encoding schemes for the applied word line signals can be used when simultaneously driving multiple word lines. Furthermore, in a simpler implementation, it will be understood that all applied word line signals in the simultaneous actuation may instead have a same pulse width.

With reference now to FIG. 2, each memory cell 14 of the 6T SRAM type includes two cross-coupled CMOS inverters 22 and 24, each inverter including a series connected p-channel and n-channel MOSFET transistor pair. The inputs and outputs of the inverters 22 and 24 are coupled to form a latch circuit having a true data storage node QT and a complement data storage node QC which store complementary logic states of the stored data bit. The cell 14 further includes two transfer (passgate) transistors 26 and 28 whose gate terminals are driven by a word line WL. In an alternative implementation, the transistors 26 and 28 may instead be driven by separate true and complement word lines (for example, $WL_T$ and $WL_C$). The source-drain path of transistor 26 is connected between the true data storage node QT and a node associated with a true bit line BLT. The source-drain path of transistor 28 is connected between the complement data storage node QC and a node associated with a complement bit line BLC. The source terminals of the p-channel transistors 30 and 32 in each inverter 22 and 24 are coupled to receive the high supply voltage (Vdd) at the high supply node, while the source terminals of the n-channel transistors 34 and 36 in each inverter 22 and 24 are coupled to receive the low supply voltage (Gnd) at the low supply node.

FIG. 3 is a timing diagram showing simultaneous application of the example pulse width modulated word line signals to plural rows of memory cells 14 in the SRAM array 12 for a given analog in-memory compute operation, and the development over time of voltages Va,T and Va,C on one corresponding pair of complementary bit lines BLT and BLC, respectively, in response to sinking of cell read current due to the pulse width(s) of those word line signals and the logic state of the bits of the computational weight stored in the corresponding column of memory cells 14. The representation of the voltage Va,T and Va,C levels as shown is just an example. Within the time of the computation cycle of the analog in-memory compute operation, the analog-to-digital converter (ADC) circuit of the column processing circuit 20 will sample (at time ts) one or more of the voltage Va,T and Va,C levels for conversion to a digital signal which is then subjected to the required digital computations for generating the decision output. After completion of the computation cycle, the voltage Va,T and Va,C levels return to the bit line precharge Vdd level.

It will be noted that a risk exists that the analog voltage on at least one of the bit lines BLT and BLC may fall from the precharge (Vdd) voltage to a level Va where an unwanted data flip occurs with respect to the stored data bit value in one of the memory cells 14 of the column. For example, a logic "1" state stored in the cell 14 of a column may be flipped to a logic "0" state. This data flip introduces a data error in the computational weight stored in the memory cells, thus jeopardizing the accuracy of subsequent in-memory compute operations.

The unwanted data flip that occurs due to an excess of bit line voltage lowering is mainly an effect of the simultaneous parallel access of the word lines in matrix vector multiplication mode during the in-memory compute operation. This problem is different from normal data flip of an SRAM bit cell due to Static-Noise-Margin (SNM) issues which happens in serial bit cell access when the bit line is close to the level of the supply voltage Vdd. During serial access, the normal data flip is instead caused by a ground bounce of the data storage nodes QT or QC.

Another concern is that it is not possible to predict the rate of discharge for the bit lines BLT and BLC since the discharge rate is dependent on the weight data values stored in the memory cells 14 of the column whose word lines are asserted during the in-memory compute operation. The variation in rate of change in voltage level on the bit lines BLT and BLC introduces a concern with non-linearity of the read operation. There is a corresponding issue with respect to setting the timing for sampling (i.e., determining when is time ts?) the one or more of the voltage Va,T and Va,C levels on the bit lines BLT and BLC for conversion to a digital signal since the bit lines of different columns will exhibit different bit line discharge rates. Additionally, a risk exists that if the sampling time ts is delayed then the voltages Va,T and Va,C on the bit lines BLT and BLC may discharge to a voltage level outside of the dynamic range of the ADC circuits.

With reference now to FIG. 4, each memory cell 14 of the 8T SRAM type includes two cross-coupled CMOS inverters 22 and 24, each inverter including a series connected p-channel and n-channel MOSFET transistor pair. The inputs and outputs of the inverters 22 and 24 are coupled to form a latch circuit having a true data storage node QT and a complement data storage node QC which store complementary logic states of the stored data bit. The cell 14 further includes two transfer (passgate) transistors 26 and 28 whose gate terminals are driven by a word line WL. The source-drain path of transistor 26 is connected between the true data storage node QT and a node associated with a true bit line BLT. The source-drain path of transistor 28 is connected between the complement data storage node QC and a node associated with a complement bit line BLC. The source terminals of the p-channel transistors 30 and 32 in each inverter 22 and 24 are coupled to receive the high supply voltage (Vdd) at the high supply node, while the source terminals of the n-channel transistors 34 and 36 in each inverter 22 and 24 are coupled to receive the low supply voltage (Gnd) at the low supply node. A signal path between the read bit line RBL and the low supply voltage reference is formed by series coupled transistors 38 and 40. The gate terminal of the (read) transistor 38 is coupled to the complement storage node QC and the gate terminal of the (transfer) transistor 40 is coupled to receive the signal on the read word line RWL.

FIG. 5 is a timing diagram showing simultaneous application of the example pulse width modulated word line signals to plural rows of memory cells 14 in the SRAM array 12 for a given analog in-memory compute operation, and the development over time of the voltage Va,R on the read bit line RBL in response to sinking of cell read current due to the pulse width(s) of those word line signals and the logic state of the bits of the computational weight stored in the column of memory cells 14. The representation of the voltage Va,R level as shown is just an example. Within the time of the computation cycle of the analog in-memory compute operation, the analog-to-digital converter (ADC) circuit of the column processing circuit 20 will sample (at time ts) the voltage Va,R level for conversion to a digital signal which is then subjected to the required digital computations for generating the decision output. After completion of the computation cycle, the voltage Va,R level returns to the bit line precharge Vdd level.

The 8T type SRAM solution does not suffer from the concern with inadvertent bit flip of the data stored in the memory latch since read out is performed through the read bit line RBL. However, like with the 6T-type SRAM solution, is not possible to predict the rate of discharge for the read bit line RBL since the discharge rate is dependent on data values stored in the memory cells 14 of the column whose word lines are asserted during the in-memory compute operation. The variation in rate of change in voltage level on the read bit line RBL introduces a concern with non-linearity of the read operation. There is a corresponding issue with respect to setting the timing for sampling (i.e., determining when is time ts?) the voltage Va,R level on the read bit line RBL for conversion to a digital signal since the read bit lines of different columns will exhibit different bit line discharge rates. Additionally, a risk exists when the sampling time ts is delayed that the voltage Va,R on the read bit line RBL may discharge to a voltage level outside of the dynamic range of the ADC circuits.

There exists a need in the art to address the foregoing issues.

SUMMARY

In an embodiment, a circuit comprises: a memory array including memory cells arranged in a matrix with plural rows and plural columns, each row including a word line connected to the memory cells of the row, each column including a bit line connected to the memory cells of the column, and each memory cell storing a bit of weight data for an in-memory computation operation; a word line driver circuit for each row having an output connected to drive the word line of the row; a row controller circuit coupled to the word line driver circuits and configured to simultaneously actuate a plurality of word lines during said in-memory computation operation; and a column processing circuit including: a discharge time sensing circuit for each column that generates an analog signal indicative of a time taken during said in-memory computation operation to discharge the bit line from a precharge voltage to a threshold voltage; analog-to-digital conversion circuitry configured to convert the analog signals to digital signals; and computation circuitry configured to perform digital signal processing calculations on the digital signals and generate a decision output for the in-memory computation operation.

The discharge time sensing circuit may, for example, comprise: a timing capacitor; a capacitor charging circuit configured to charge the timing capacitor to a first voltage level prior to the in-memory computation operation; a capacitor discharging circuit configured to apply a discharge current to the timing capacitor during the in-memory computation operation; and a timing control circuit configured to terminate application of the discharge current when the discharge of the bit line from the precharge voltage reaches the threshold voltage. The analog signal is a second voltage level remaining on the timing capacitor after termination of the discharge current application.

In an embodiment, a circuit comprises: a memory array including memory cells arranged in a matrix with plural rows and plural columns, each row including a word line connected to the memory cells of the row, each column including a bit line connected to the memory cells of the column, and each memory cell storing a bit of weight data for an in-memory computation operation; a word line driver circuit for each row having an output connected to drive the word line of the row; a row controller circuit coupled to the word line driver circuits and configured to simultaneously actuate a plurality of word lines during said in-memory computation operation; and a column processing circuit including: a discharge time sensing circuit for each column that generates an analog signal indicative of a time taken during said in-memory computation operation to discharge the bit line from a precharge voltage to a threshold voltage; a bit line clamping circuit configured to clamp the bit line to a clamp voltage following discharge of the bit line to the threshold voltage; analog-to-digital conversion circuitry configured to convert the analog signals to digital signals; and computation circuitry configured to perform digital signal processing calculations on the digital signals and generate a decision output for the in-memory computation operation.

In an embodiment, a method comprises: storing bits of weight data for an in-memory computation operation in memory cells of a memory array including plural rows and plural columns, each row including a word line connected to the memory cells of the row, and each column including a bit line connected to the memory cells of the column; simultaneously actuating a plurality of word lines during said in-memory computation operation; generating an analog signal indicative of a time taken during said in-memory computation operation to discharge each bit line from a precharge voltage to a threshold voltage; converting the analog signals to digital signals; and performing digital signal processing calculations on the digital signals to generate a decision output for the in-memory computation operation.

The generation of the analog signal may, for example, comprise: charging a timing capacitor to a first voltage level prior to the in-memory computation operation; applying a discharge current to the timing capacitor during the in-memory computation operation; and terminating application of the discharge current when the discharge of the bit line from the precharge voltage reaches the threshold voltage. The analog signal is a second voltage level remaining on the timing capacitor after termination of the discharge current application.

BRIEF DESCRIPTION OF THE DRAWINGS

For a better understanding of the embodiments, reference will now be made by way of example only to the accompanying figures in which.

DETAILED DESCRIPTION OF THE DRAWINGS

Figure 6:
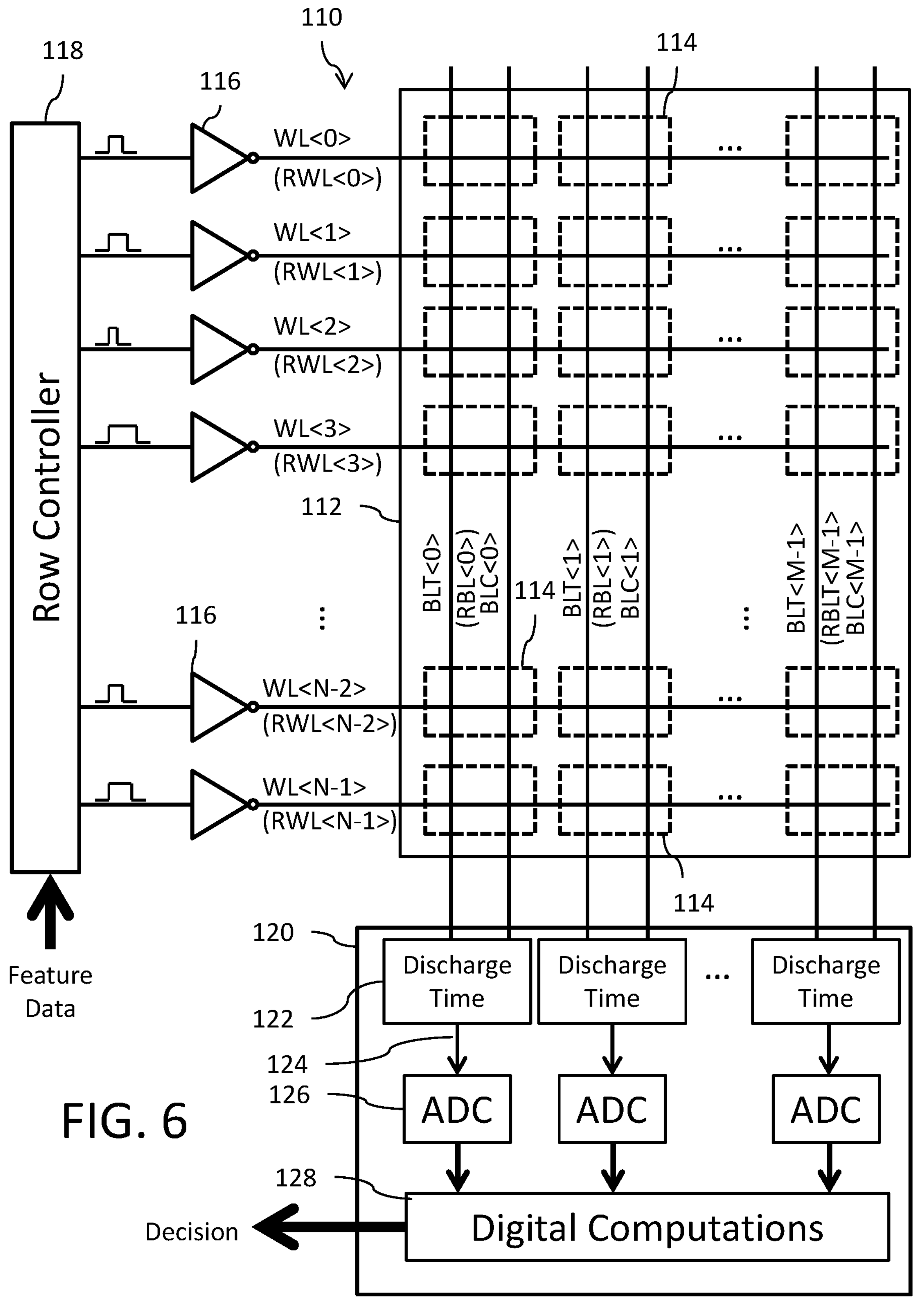
FIG. 6 is a schematic diagram of an analog in-memory computation circuit utilizing a bit line accumulation readout scheme.

Reference is now made to FIG. 6 which shows a block diagram of an analog in-memory computation circuit 110. The circuit 110 is implemented using a memory circuit which includes a memory array 112 (for example, a static random access memory (SRAM) array) formed by a plurality of memory cells 114 arranged in a matrix format having N rows and M columns. Each memory cell 114 is programmed to store a bit of data. In conventional memory access processing, the stored data in the memory array 112 can be any desired user data. In analog in-memory computation processing, the stored data in the memory array 112 comprises computational weight or kernel data for an analog in-memory compute operation. In this context, the analog in-memory compute operation is understood to be a form of a high dimensional Matrix Vector Multiplication (MVM) supporting multi-bit weights that are stored in multiple bit cells of the memory. The group of bit cells (in the case of a multibit weight) can be considered as a virtual synaptic element. Each bit of data stored in the memory array, whether user data or weight data, has either a logic "1" or a logic "0" value.

Figure 2:
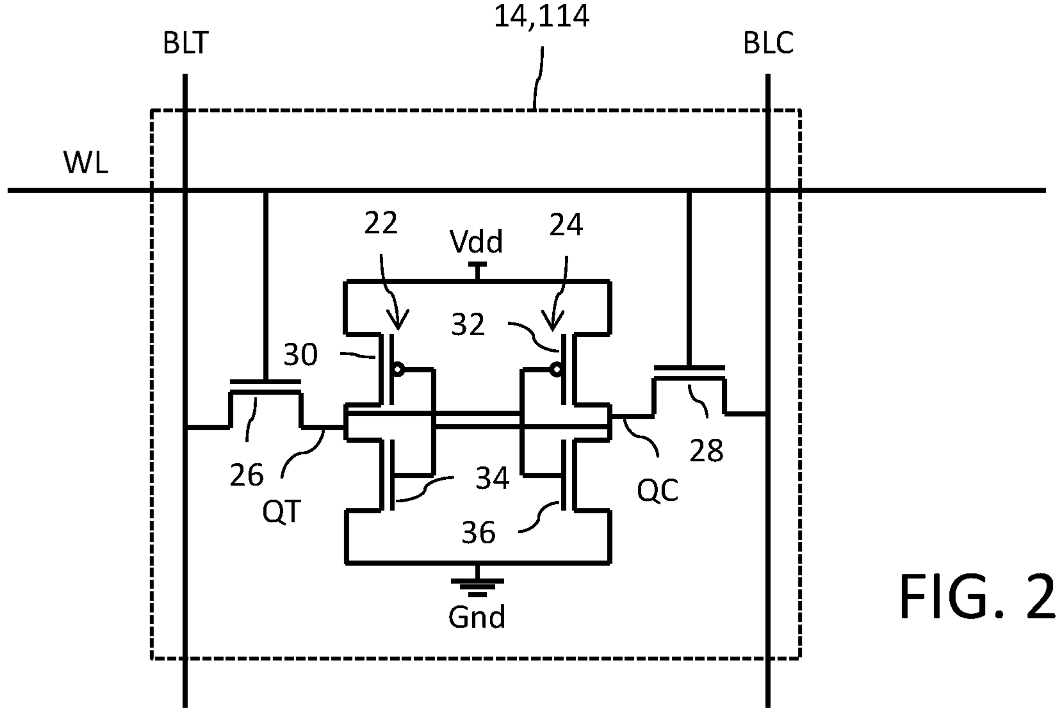
FIG. 2 is a circuit diagram of a standard 6T static random access memory (SRAM) cell.
Figure 3:
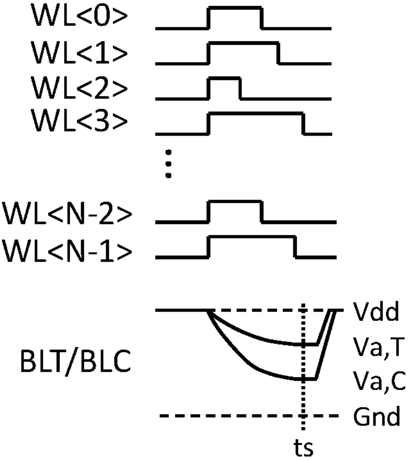
FIG. 3 a timing diagram illustrating an analog in-memory compute operation using the 6T-type SRAM in the circuit of FIG. 1.

In an embodiment, the memory array 112 includes a plurality of memory cells 114 of the 6T SRAM type (like that shown in FIG. 2 and previously described herein). Each memory cell 114 includes a word line WL and a pair of complementary bit lines BLT and BLC. The cells 114 in a common row of the matrix are connected to each other through a common word line WL. The cells 114 in a common column of the matrix are connected to each other through a common pair of complementary bit lines BLT and BLC. Each word line WL is driven by a word line driver circuit 116 which may be implemented as a CMOS driver circuit (for example, a series connected p-channel and n-channel MOSFET transistor pair forming a logic inverter circuit). The word line signals applied to the word lines, and driven by the word line driver circuits 116, are generated from feature data input to the in-memory computation circuit 110 and controlled by a row controller circuit 118.

Figure 4:
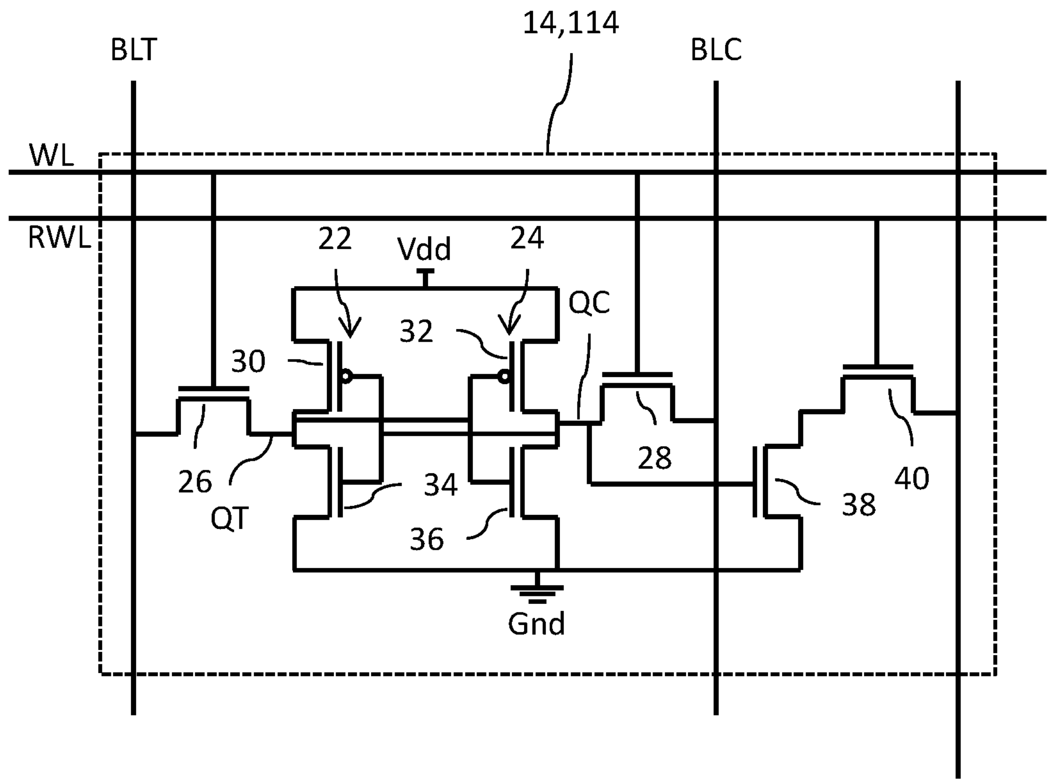
FIG. 4 is a circuit diagram of an 8T SRAM cell.
Figure 5:
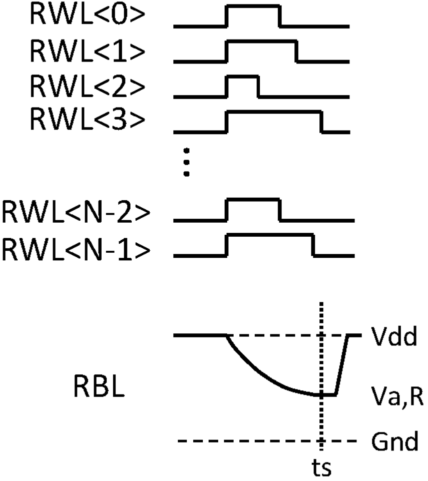
FIG. 5 is a timing diagram illustrating an analog in-memory compute operation using the 8T-type SRAM in the circuit of FIG. 1.

In another embodiment, the memory array 112 includes a plurality of memory cells 114 of the 8T SRAM type (like that shown in FIG. 4 and previously described herein). Each memory cell 114 includes a word line WL, a read word line RWL, a pair of complementary bit lines BLT and BLC and a read bit line RBL. The cells 114 in a common row of the matrix are connected to each other through a common word line WL and common read word line RWL. The cells 114 in a common column of the matrix are connected to each other through a common pair of complementary bit lines BLT and BLC and a common read bit line RBL. Each word line WL and read word line RWL is driven by a word line driver circuit 116 which may be implemented as a CMOS driver circuit (for example, a series connected p-channel and n-channel MOSFET transistor pair forming a logic inverter circuit). The word line signals applied to the read word lines RWL, and driven by the word line driver circuits 116, are generated from feature data input to the in-memory computation circuit 110 and controlled by a row controller circuit 118.

In a further embodiment, the memory array 112 includes a plurality of non-volatile memory (NVM) cells 114. Each memory cell 114 includes a word line WL and at least one bit line BL. The cells 114 in a common row of the matrix are connected to each other through a common word line WL. The cells 114 in a common column of the matrix are connected to each other through a common bit line BL. Each word line WL is driven by a word line driver circuit 116 which may be implemented as a CMOS driver circuit (for example, a series connected p-channel and n-channel MOSFET transistor pair forming a logic inverter circuit). The word line signals applied to the word lines WL, and driven by the word line driver circuits 116, are generated from feature data input to the in-memory computation circuit 110 and controlled by a row controller circuit 118.

The word line driver circuits 116 are typically coupled to receive a high supply voltage (Vdd) at a high supply node and are referenced to a low supply voltage (Gnd) at a low supply node.

Figure 1:
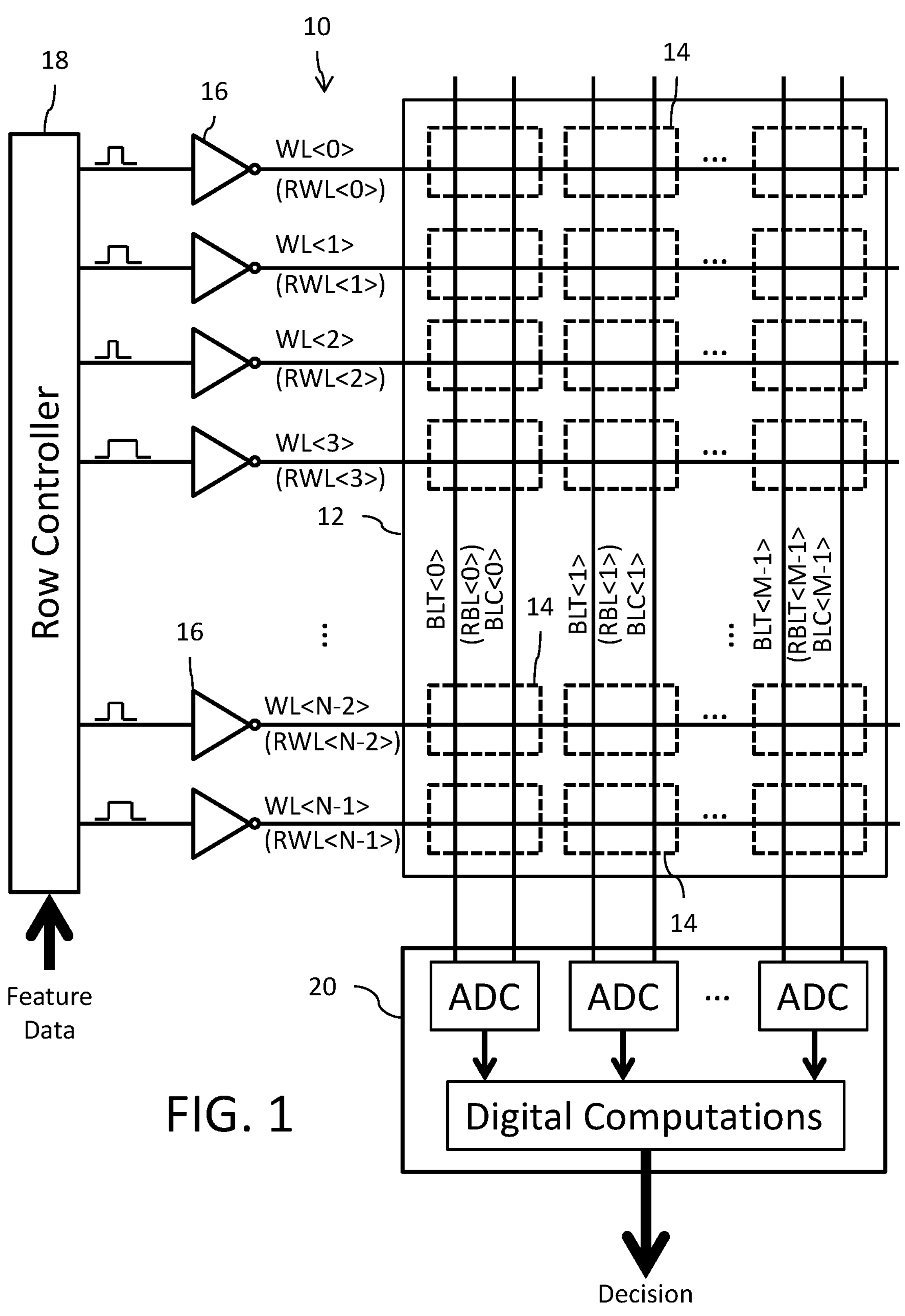
FIG. 1 is a schematic diagram of an analog in-memory computation circuit.

A column processing circuit 120 includes a discharge time sensing circuit 122 for each column. In the embodiment where the memory array 112 includes a plurality of memory cells 114 of the 6T SRAM type, the discharge time sensing circuit 122 is coupled to at least one bit line of the pair of complementary bit lines BLT and BLC for the corresponding column of memory cells 114. In the embodiment where the memory array 112 includes a plurality of memory cells 114 of the 8T SRAM type, the discharge time sensing circuit 122 is coupled to the read bit line RBL for the corresponding column of memory cells 114. In the embodiment where the memory array 112 includes a plurality of memory cells 114 of the NVM type, the discharge time sensing circuit 122 is coupled to the bit line BL for the corresponding column of memory cells 114. The discharge time sensing circuit 122 is configured to generate an analog output signal 124 having a value (for example, a voltage level) indicative of an amount of time taken for the voltage level Va,T (on the true bit line BLT), or the voltage level Va,C (on the complement bit line BLC), or the voltage level Va,R (on the read bit line RBL), to reach a threshold discharge voltage level Vdis. Importantly, that threshold discharge voltage level Vdis is selectively chosen by design to be greater than a voltage level Vflip where a risk exists that an inadvertent bit flip of the data stored in the memory latch of the memory cell 114 could occur. The value of the analog output signal 124 is then sampled by an analog-to-digital converter (ADC) circuit 126 for conversion to a digital signal. It will be noted that the conversion here of the analog signal output by the discharge time sensing circuit 122 is different than the FIG. 1 embodiment where conversion is performed directly on the bit line voltage. A digital computation circuit 128 of the column processing circuit 120 performs digital calculations on the digital signals of the M columns and generates a decision output for the in-memory compute operation.

The discharge time sensing circuit 122 may further include a clamp circuit that is actuated in response to the voltage level on the bit line (BLT, BLC) reaching the threshold discharge voltage level Vdis to clamp the bit line voltage to a voltage level greater than the voltage level Vflip (for example, to a clamp voltage Vclamp greater than the threshold discharge voltage level Vdis). This ensures that the risk of an inadvertent bit flip of the data stored in the memory latch of the memory cell 114 occurring as a result of the in-memory computation operation is minimized, if not completely eliminated.

Although not explicitly shown in FIG. 6, it will be understood that the circuit 110 further includes conventional row decode, column decode, and read-write circuits known to those skilled in the art for use in connection with writing bits of data (for example, the computational weight data) to, and reading bits of data from, the SRAM cells 14 of the memory array 112. This operation is referred to as a conventional memory access mode and is distinguished from the analog in-memory compute operation discussed above.

The row controller circuit 118 receives the feature data for the in-memory compute operation and in response thereto performs the function of selecting which ones of the word lines WL<0> to WL<N−1> (or read word lines RWL<0> to RWL<N−1>) are to be simultaneously accessed (or actuated) in parallel during an analog in-memory compute operation, and further functions to control application of pulsed signals to the word lines in accordance with that in-memory compute operation. FIG. 6 illustrates, by way of example only, the simultaneous actuation of all N word lines with the pulsed word line signals, it being understood that in-memory compute operations may instead utilize a simultaneous actuation of fewer than all rows of the SRAM array. The analog signals on a given pair of complementary bit lines BLT and BLC (or the analog signal on the read bit line RBL in the 8T-type implementation) are (is) dependent on the logic state of the bits of the computational weight stored in the memory cells 114 of the corresponding column and the width(s) of the pulsed word line signals applied to those memory cells 114.

The implementation illustrated in FIG. 6 shows an example in the form of a pulse width modulation (PWM) for the applied word line signals for the in-memory compute operation dependent on the received feature data. The use of PWM or period pulse modulation (PTM) for the applied word line signals is a common technique used for the in-memory compute operation based on the linearity of the vector for the multiply-accumulation (MAC) operation. The pulsed word line signal format can be further evolved as an encoded pulse train to manage block sparsity of the feature data of the in-memory compute operation. It is accordingly recognized that an arbitrary set of encoding schemes for the applied word line signals can be used when simultaneously driving multiple word lines. Furthermore, in a simpler implementation, it will be understood that all applied word line signals in the simultaneous actuation may instead have a same pulse width.

Figure 7:
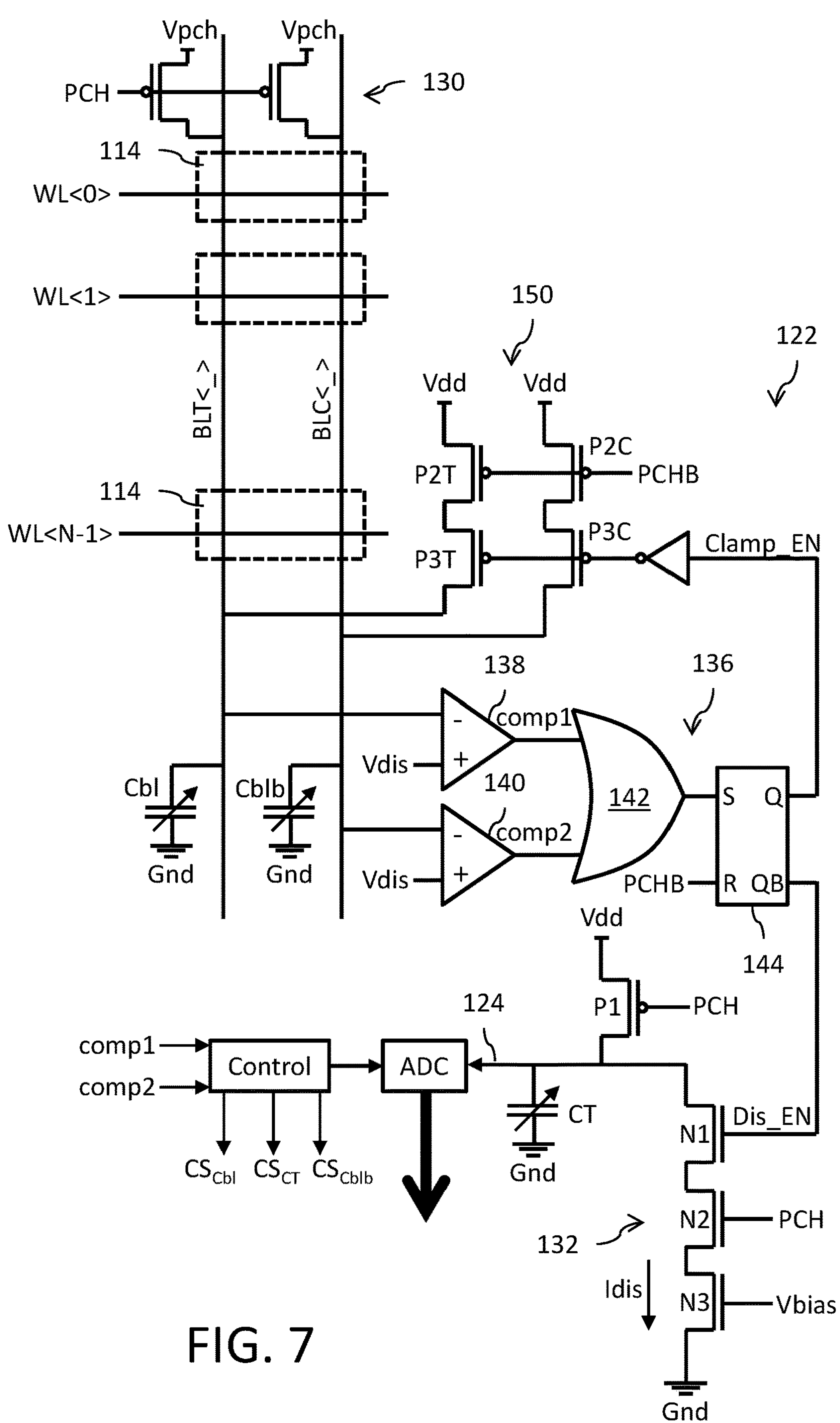
FIG. 7 is a circuit diagram for an embodiment of a discharge time sensing circuit.

Reference is now made to FIG. 7 which shows a circuit diagram for an embodiment of the discharge time sensing circuit 122. This embodiment of the discharge time sensing circuit 122 may, for example, be utilized in connection with the embodiment of the memory array 112 utilizing a plurality of memory cells 114 of the 6T SRAM type. The memory cells 114 of a given column of the array 112 are connected to each other through a common pair of complementary bit lines BLT<_> and BLC<_>. The memory cell 114 in each row is coupled to a corresponding word line WL.

A precharge circuit 130 is provided to precharge the pair of complementary bit lines BLT<_> and BLC<_> to a precharge voltage Vpch level (where, for example, Vpch=Vdd). The precharge circuit 130 is formed by a pair of p-channel MOSFET devices whose source-drain paths are coupled between the precharge voltage node and a respective one of the bit lines. The gate terminals of the pair of p-channel MOSFET devices in the precharge circuit 130 are driven by a precharge signal PCH. Prior to the in-memory computation operation, the precharge signal PCH is driven logic low to turn on the pair of p-channel MOSFET devices and precharge the bit lines BLT, BLC to the precharge voltage Vpch level. At the start of the in-memory computation operation, the precharge signal PCH is driven logic high to turn off the pair of p-channel MOSFET devices in the precharge circuit 130 (and thus permit discharge of the bit lines BLT, BLC in response to the applied word line signals and the logic state of the weight data stored in the memory cells 114 of the column).

The discharge time sensing circuit 122 includes a timing capacitor CT having a first terminal coupled, preferably directly connected, to an output node at which the analog output signal 124 is generated and a second terminal coupled, preferably directly connected, to a reference voltage node (for example, ground). A capacitor charging circuit is formed by a p-channel MOSFET device P1. A source-drain path of device P1 is coupled between the supply voltage node (Vdd) and the output node for analog output signal 124. A gate terminal of the device P1 is driven by the precharge signal PCH. Thus, like with the precharge circuit 130, prior to the in-memory computation operation the precharge signal PCH is driven logic low to turn on device P1 and precharge the timing capacitor CT to the supply voltage Vdd level. At the start of the in-memory computation operation, the precharge signal PCH is driven logic high to turn off device P1 (and thus permit discharge of the capacitor voltage during a timer on measurement period).

The discharge time sensing circuit 122 further includes a capacitor discharge circuit 132 formed by the series coupling, preferably series connection, of the source-drain paths of n-channel MOSFET devices N1, N2, and N3. Device N1 has a drain coupled, preferably directly connected, to the first terminal of the timing capacitor CT (i.e., at the output node at which the analog output signal 124 is generated) and a source coupled, preferably directly connected, to a first intermediate node. The gate of device N1 is driven by a discharge enable signal (Dis_EN) and is turned on when the discharge enable signal Dis_EN is logic high. Device N2 has a drain coupled, preferably directly connected, to the first intermediate node and a source coupled, preferably directly connected, to a second intermediate node. The gate of device N2 is driven by the precharge signal PCH and is turned on when the precharge signal PCH is logic high. Device N3 has a drain coupled, preferably directly connected, to the second intermediate node and a source coupled, preferably directly connected, to the ground reference node. The gate of device N3 is biased by a bias voltage Vbias. Device N3 accordingly is configured for operation as a current source to sink (when discharge enable signal is logic high and the precharge signal PCH is logic high) a constant discharge current Idis from the output node at which the analog output signal 124 is generated. Prior to the in-memory computation operation, the precharge signal PCH is driven logic low to turn off device N2 and thus control the capacitor discharge circuit 132 to be in an off state. As noted above, during this time the device P1 is turned on to charge the timing capacitor CT to the Vdd voltage level. At the start of the in-memory computation operation, the precharge signal PCH is driven logic high to turn off device P1 and turn on device N2 thus triggering application of the constant discharge current Idis). With the discharge enable signal Dis_EN in a logic high state, the capacitor discharge circuit 132 is enabled to sink the constant current Idis and discharge the timing capacitor CT. When the discharge enable signal Dis_EN transitions to a logic low state at the end of the timer on measurement period, the capacitor discharge circuit 132 is disabled, further discharge of the timing capacitor CT is terminated, and the analog output signal 124 (in this case being the remaining voltage level on the timing capacitor CT) is ready for sampling by the ADC circuit.

In an embodiment, the timing capacitor CT may be implemented as a variable capacitance circuit where the capacitance of the timing capacitor CT is controlled by a control circuit through a capacitance setting signal $CS_{CT}$. The variable capacitance of the timing capacitor CT is selected by design to ensure that transistor N3 remains in saturation throughout the various time durations being measured by the discharge time sensing circuit 122.

Additionally, a variable capacitance circuit may be coupled to each of the bit lines BLT, BLC to supplement the inherent capacitances of the bit lines themselves. The capacitance of these supplemental capacitors Cbl and Cblb is controlled by the control circuit through a pair of capacitance setting signals $CS_{Cbl}$ and $CS_{Cblb}$. The variable capacitances of the supplemental capacitors Cbl and Cblb are selected by design to program the bit line discharge rates.

The discharge time sensing circuit 122 also includes a timing control circuit 136 for controlling a duration of (more specifically, timing for the end of) the timer on measurement period. The circuit 136 includes: a first comparator circuit 138 having an inverting input coupled to the true bit line BLT and a non-inverting input coupled to receive the threshold discharge voltage Vdis, and a second comparator circuit 140 having an inverting input coupled to the complement bit line BLC and a non-inverting input coupled to receive the threshold discharge voltage Vdis. The output of first comparator circuit 138 (signal comp1) transitions to logic high when the voltage Va,T on the true bit line BLT falls below the threshold discharge voltage Vdis. Likewise, the output of second comparator circuit 140 (signal comp2) transitions to logic high when the voltage Va,C on the complement bit line BLC falls below the threshold discharge voltage Vdis. The signals comp1, comp2 output from the comparators 138, 140 are logically combined by a combinatorial logic circuit 142 formed, for example, by a logic OR gate. The timing control circuit 136 further includes a set/reset (S/R) flip flop 144 whose set input (S) is coupled to the output of the combinatorial logic circuit 142 and whose reset input (R) is coupled to receive a logical complement (PCHB) of the precharge signal PCH. Thus, the data output (Q) of the flip flop 144 is set logic high (and the complement data output (QB) is set logic low) in response to the assertion logic high of the signal at the set input (S). Conversely, the data output (Q) of the flip flop 144 is set logic low (and the complement data output (QB) is set logic high) in response to the assertion logic high of the precharge signal PCH at the reset input (R).

The complement data output (QB) of the flip flop 144 is coupled to provide the discharge enable signal Dis_EN for controlling operation of the device N1 in the capacitor discharge circuit 132. Thus, device N1 is turned on in response to the complement data output (QB) of the flip flop 144 being set logic high (i.e., discharge enable signal Dis_EN being logic high), and is turned off in response to the complement data output (QB) of the flip flop 144 being set logic low (i.e., discharge enable signal Dis_EN being logic low). Prior to the in-memory computation operation, the precharge signal PCH is driven logic low and thus the logical complement PCHB is logic high which causes the reset of the flip flop 144 and the output of a logic high state for the discharge enable signal Dis_EN. At the start of the in-memory computation operation, the precharge signal PCH is driven logic high (to trigger start of the timer on measurement period) and thus the logical complement PCHB is logic low. The word lines WL are asserted and the bit lines BLT, BLC begin to discharge from the precharge voltage Vpch dependent on the logic state of the weight data stored in the memory cells 114 and the pulse widths of the simultaneously asserted word line signals. When the voltage on either bit line BLT, BLC falls below the threshold discharge voltage Vdis, the output of the corresponding comparator 138, 140 transitions to logic high. This logic high state passes through the OR gate 142 and is applied to the set input of the flip flop 144. In response thereto, the complement data output (QB) of the flip flop 144 transitions to logic low and the logic low state of the discharge enable signal Dis_EN disables the capacitor discharge circuit 132. As noted above, further discharge of the timing capacitor CT is then terminated (thus ending the timer on measurement period). The remaining voltage on the timing capacitor CT is indicative of the amount of time taken to discharge one of the bit lines BLT, BLC from the precharge voltage Vpch to the threshold discharge voltage Vdis.

The discharge time sensing circuit 122 still further includes a bit line clamping circuit 150. The bit line clamping circuit 150 is formed by a first pair of p-channel MOSFET devices P2T, P3T whose source-drain paths are series coupled, preferably connected, between the supply voltage node Vdd and the true bit line BLT, and a second pair of p-channel MOSFET devices P2C, P3C whose source-drain paths are series coupled, preferably connected, between the supply voltage node Vdd and the complement bit line BLC. The gate terminals of the device P2T, P2C are driven by the logical complement (PCHB) of the precharge signal PCH. The gate terminals of the device P3T, P3C are driven by the logical complement of the data output (Q) of the flip flop 144 (which comprises a clamp enable signal (Clamp_EN)). The bit line clamping circuit 150 operates in response to assertion logic low of the PCHB signal and assertion logic high of the clamp enable signal Clamp_EN to turn on transistors P2T, P2C, P3T and P3C and clamp the voltage level on the complementary bit lines BLT, BLC to the clamp voltage Vclamp level (where Vclamp>Vdis). As noted above, the logic high state from the output of one of the comparators 138, 140 passes through the OR gate 142 for application to the set input of the flip flop 144. This causes the data output (Q) of the flip flop 144 to transition to logic high and the logic high state of the clamp enable signal Clamp_EN (inverted by the logic NOT gate) turns on devices P3C, P3T to enable operation of the bit line clamping circuit 150 to clamp the voltage level on the bit lines BLT, BLC to the clamp voltage Vclamp level.

The voltage across the capacitor CT is sampled by the ADC circuit. There is a question, however, during operation as to whether this sampled voltage is related to the discharge of the true bit line BLT or the complement bit line BLC. This ambiguity is resolved by the control circuit which receives the signals comp1, comp2 output from the first and second comparator circuits 138, 140, respectively. If the signal comp1 changes state first, the control circuit will inform the ADC circuit that the sampled voltage is related to the discharge of the true bit line BLT. Conversely, if the signal comp2 changes state first, the control circuit will inform the ADC circuit that the sampled voltage is related to the discharge of the complement bit line BLC. This information may then be included with the digitized voltage value for further processing by the digital computation circuitry.

Figure 8:
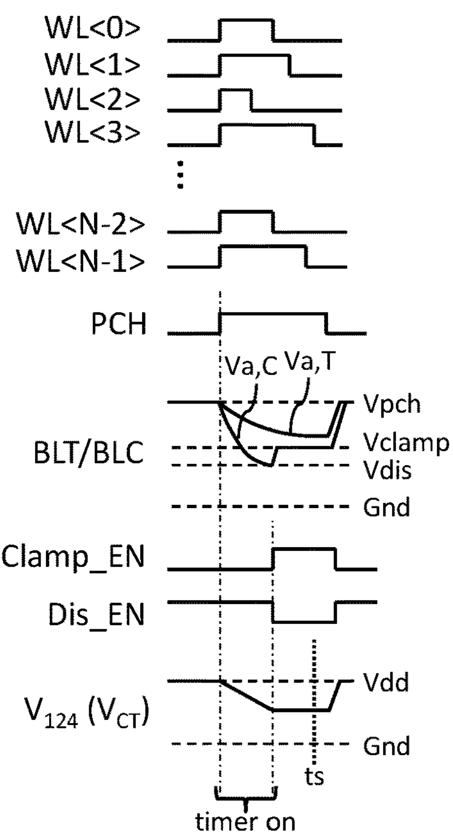
FIG. 8 illustrates a timing diagram for operation of the analog in-memory computation circuit of FIG. 6 using the discharge time sensing circuit of FIG. 7.

FIG. 8 illustrates a timing diagram for operation of the analog in-memory computation circuit 110 using the discharge time sensing circuit 122 of FIG. 7. Prior to the in-memory computation operation, the precharge signal PCH is driven logic low to turn on the pair of p-channel MOSFET devices and precharge the bit lines BLT, BLC to the precharge voltage Vpch level. The logic low precharge signal PCH further turns on device P1 and precharges the timing capacitor CT (reference $V_{124}$ ($V_{CT}$)) to the supply voltage Vdd level. The logical complement PCHB is logic high which causes the reset of the flip flop 144 and the output of a logic high state for the discharge enable signal Dis_EN (disabling the discharge circuit) and a logic low state for the clamp enable signal Clamp_EN (disabling the clamping circuit).

At the start of the in-memory computation operation, the precharge signal PCH is driven logic high to turn off the pair of p-channel MOSFET devices in the precharge circuit 130 and turn off the device P1 in the capacitor charging circuit. This will also turn on devices P2T, P2C of the bit line clamping circuit 150 (although the clamping circuit remains disabled by signal Clamp_EN). The pulses of the word line signals are simultaneously applied to the word lines WL and the bit lines BLT, BLC begin to discharge from the precharge voltage Vpch at a rate dependent on the logic state of the weigh bit stored in the memory cells 114 and the width of the applied word line signal pulses. The logic high state of the precharge signal PCH also turns on device N2 of the capacitor discharge circuit 132 to begin the timer on measurement period, and the sinking current Idis begins to discharge the voltage stored on the timing capacitor CT.

When either bit line voltage Va,T, Va,C falls below the threshold discharge voltage Vdis, the comparator 138, 140 output transitions to logic high and the flip flop 144 is set. The discharge enable signal Dis_EN transitions to logic low to terminate further discharge of the timing capacitor CT (ending the timer on measurement period) and the clamp enable signal Clamp_EN transitions to logic high to enable operation of the bit line clamping circuit 150 to clamp the voltage level on the complementary bit lines BLT, BLC to the clamp voltage Vclamp level.

At this point, the remaining voltage on the timing capacitor CT is available as the analog signal 124 to be sampled by the ADC circuit at time ts. The in-memory computation operation then ends with the precharge signal PCH being driven logic low. In the illustrated example, it is the bit line voltage Va,C that falls below the threshold discharge voltage Vdis first, and as a result the comparator 140 output signal comp2 transitions to logic high first. This is detected by the control circuit and this information is provided through the ADC circuit to indicate that the sampled voltage is associated with discharge of the complement bit line.

Figure 9:
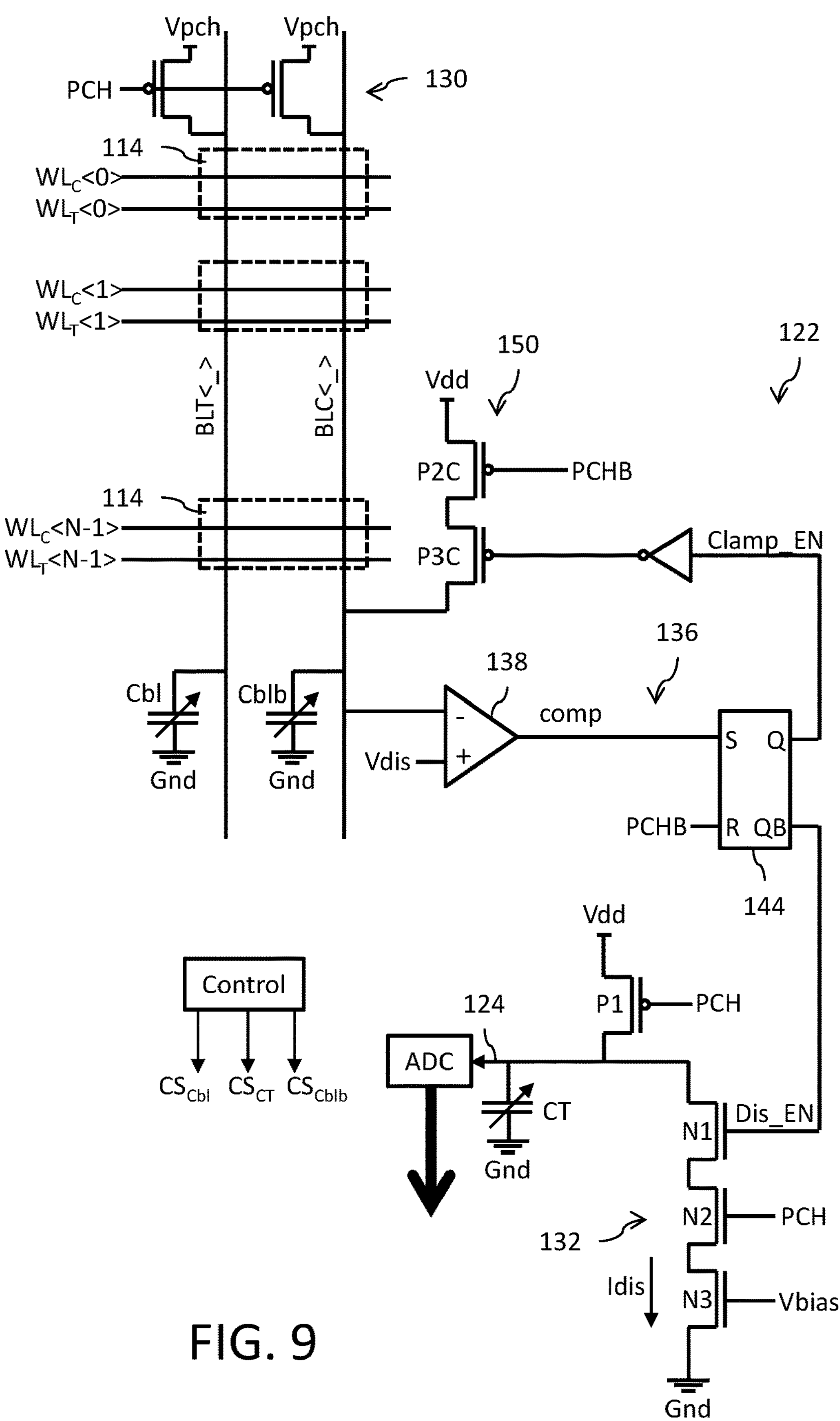
FIG. 9 is a circuit diagram for another embodiment of a discharge time sensing circuit.

Reference is now made to FIG. 9 which shows a circuit diagram for another embodiment of the discharge time sensing circuit 122. Like references in FIGS. 7 and 9 refer to same or similar components, the description of which will not be repeated for sake of brevity. The embodiment of the discharge time sensing circuit 122 in FIG. 9 differs from the embodiment of the discharge time sensing circuit 122 in FIG. 7 primarily in the word line configuration of the memory cells 114 and the sensing of the bit line discharge on only one of the two complementary bit lines BLT, BLC. With respect to the configuration of the memory cells 114, each memory cell supports separate word line access to the true data storage node QT and the complement data storage node QC using separate true and complement word lines $WL_T$, $WL_C$, where the word line $WL_T$ is connected to the gate of transistor 26 and the word line $WL_C$ is connected to the gate of transistor 28. During the in-memory computation operation, word line signal pulses are applied only to the complement word line $WL_C$, while the true word line $WL_T$ remains deasserted. Because of this configuration, there will only be a bit line discharge on the complement bit line BLC, and thus the timing control circuit 136 and bit line clamping circuit 150 of discharge time sensing circuit 122 are active only on the complement bit line BLC.

Figure 10:
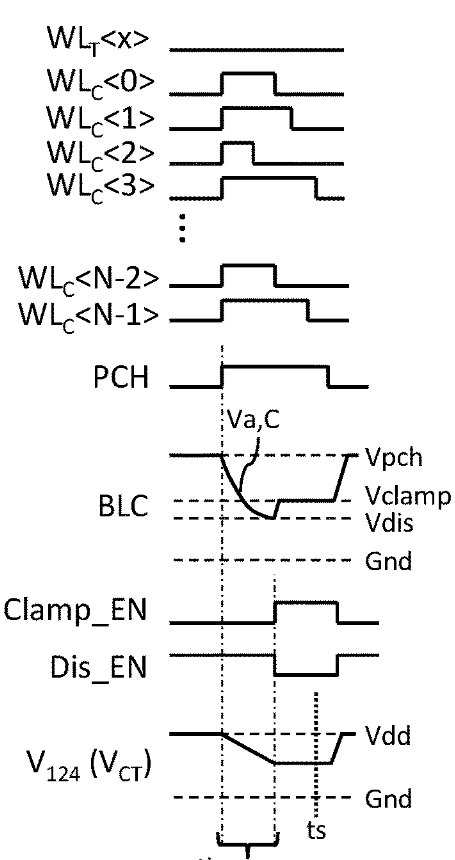
FIG. 10 illustrates a timing diagram for operation of the analog in-memory computation circuit of FIG. 6 using the discharge time sensing circuit of FIG. 9.

FIG. 10 illustrates a timing diagram for operation of the analog in-memory computation circuit 110 using the discharge time sensing circuit 122 of FIG. 9. It will be noted that operation is similar to that shown in FIG. 8 and described above except that only the complement word lines $WL_C$<x> are actuated (with the true word lines $WL_T$<x> deactuated) and comparison to the threshold voltage Vdis is performed only with respect to the complement bit line BLC voltage.

Figure 11:
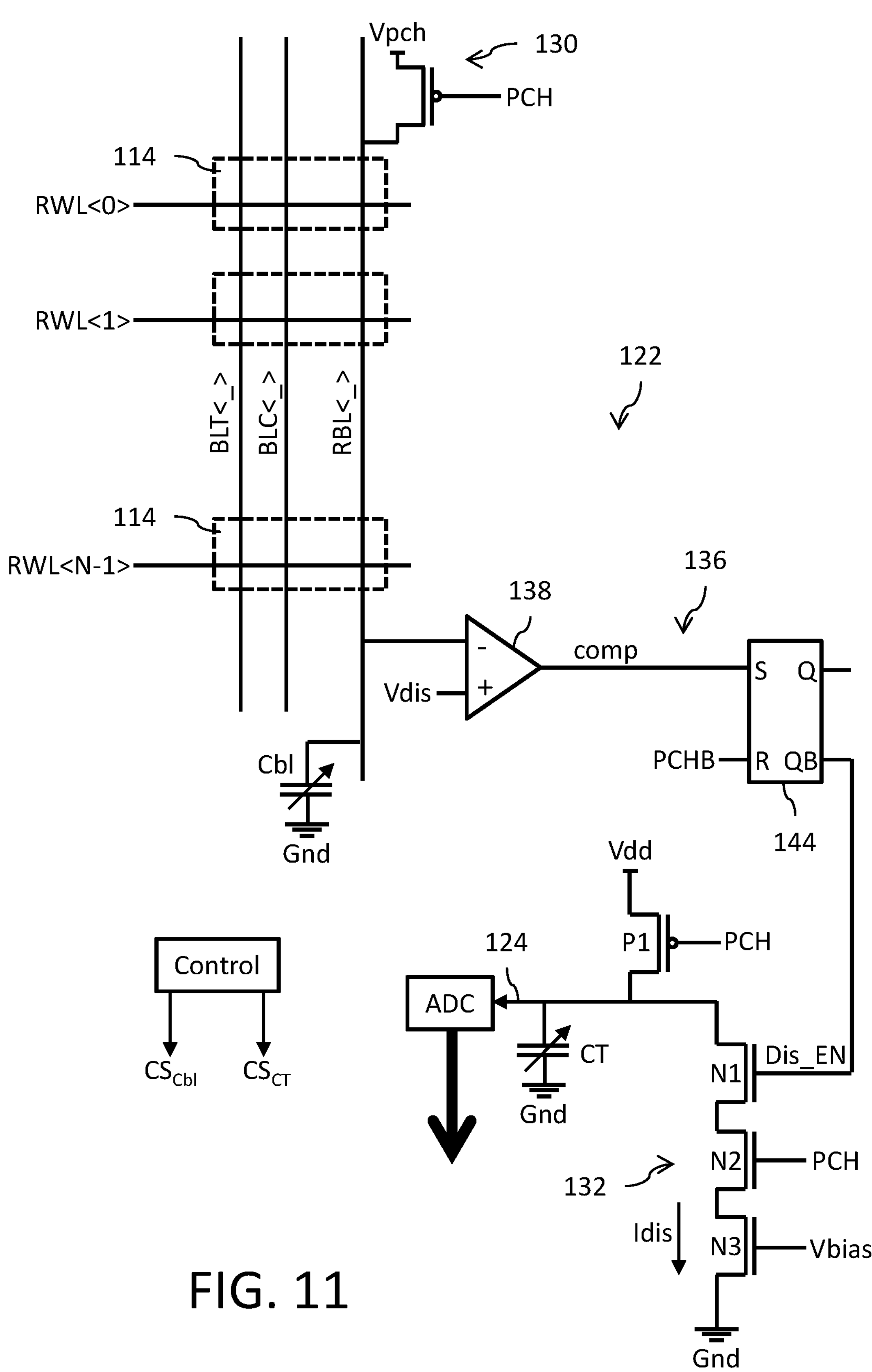
FIG. 11 is a circuit diagram for a further embodiment of a discharge time sensing circuit.

Reference is now made to FIG. 11 which shows a circuit diagram for a further embodiment of the discharge time sensing circuit 122. This embodiment of the discharge time sensing circuit 122 is utilized in connection with the embodiment of the memory array 112 utilizing a plurality of memory cells 114 of the 8T SRAM type. The memory cells 114 of a given column of the array 112 are connected to each other through a common pair of complementary bit lines BLT<_> and BLC<_> and through a read bit line RBL<_>. The memory cell 114 in each row is coupled to a corresponding word line WL.

A precharge circuit 130 is provided to precharge the read bit line RBL<_> to a precharge voltage Vpch level (where, for example, Vpch=Vdd). The precharge circuit 130 is formed by a p-channel MOSFET device whose source-drain path is coupled between the precharge voltage node and the read bit line. The gate terminal of the p-channel MOSFET device in the precharge circuit 130 is driven by a precharge signal PCH. Prior to the in-memory computation operation, the precharge signal PCH is driven logic low to turn on the p-channel MOSFET device and precharge the read bit line RBL to the precharge voltage Vpch level. At the start of the in-memory computation operation, the precharge signal PCH is driven logic high to turn off the p-channel MOSFET device in the precharge circuit 130 (and thus permit discharge of the read bit line RBL in response to the applied word line signals and the logic state of the weight data stored in the memory cells 114 of the column).

The discharge time sensing circuit 122 includes a timing capacitor CT having a first terminal coupled, preferably directly connected, to an output node at which the analog output signal 124 is generated and a second terminal coupled, preferably directly connected, to a reference voltage node (for example, ground). A capacitor charging circuit is formed by a p-channel MOSFET device P1. A source-drain path of device P1 is coupled between the supply voltage node (Vdd) and the output node for analog output signal 124. A gate terminal of the device P1 is driven by the precharge signal PCH. Thus, like with the precharge circuit 130, prior to the in-memory computation operation, the precharge signal PCH is driven logic low to turn on device P1 and precharge the timing capacitor CT to the supply voltage Vdd level. At the start of the in-memory computation operation, the precharge signal PCH is driven logic high to turn off device P1 (and thus permit discharge of the capacitor voltage during a timer on measurement period).

The discharge time sensing circuit 122 further includes a capacitor discharge circuit 132 formed by the series coupling, preferably series connection, of the source-drain paths of n-channel MOSFET devices N1, N2, and N3. Device N1 has a drain coupled, preferably directly connected, to the first terminal of the timing capacitor CT (i.e., at the output node at which the analog output signal 124 is generated) and a source coupled, preferably directly connected, to a first intermediate node. The gate of device N1 is driven by a discharge enable signal (Dis_EN) and is turned on when the discharge enable signal Dis_EN is logic high. Device N2 has a drain coupled, preferably directly connected, to the first intermediate node and a source coupled, preferably directly connected, to a second intermediate node. The gate of device N2 is driven by the precharge signal PCH and is turned on when the precharge signal PCH is logic high. Device N3 has a drain coupled, preferably directly connected, to the second intermediate node and a source coupled, preferably directly connected, to the ground reference node. The gate of device N3 is biased by a bias voltage Vbias. Device N3 accordingly is configured for operation as a current source to sink (when discharge enable signal is logic high and the precharge signal PCH is logic high) a constant discharge current Idis from the output node at which the analog output signal 124 is generated. Prior to the in-memory computation operation, the precharge signal PCH is driven logic low to turn off device N2 and thus control the capacitor discharge circuit 132 to be in an off state. As noted above, during this time the device P1 is turned on to charge the timing capacitor CT to the Vdd voltage level. At the start of the in-memory computation operation, the precharge signal PCH is driven logic high to turn off device P1 and turn on device N2. With the discharge enable signal Dis_EN in a logic high state, the capacitor discharge circuit 132 is enabled to sink the constant current Idis and discharge the timing capacitor CT. When the discharge enable signal Dis_EN transitions to a logic low state at the end of the timer on measurement period, the capacitor discharge circuit 132 is disabled, further discharge of the timing capacitor CT is terminated, and the analog output signal 124 (in this case being the remaining voltage level on the timing capacitor CT) is ready for sampling by the ADC circuit.

In an embodiment, the timing capacitor CT may be implemented as a variable capacitance circuit where the capacitance of the timing capacitor CT is controlled by a control circuit through a capacitance setting signal $CS_{CT}$. The variable capacitance of the timing capacitor CT is selected by design to ensure that transistor N3 remains in saturation throughout the various time durations being measured by the discharge time sensing circuit 122.

Additionally, a variable capacitance circuit may be coupled to the read bit line RBL to supplement the inherent capacitance of the bit line itself. The capacitance of the supplemental capacitor Cbl is controlled by the control circuit through a capacitance setting signal $CS_{Cbl}$. The variable capacitance of the supplemental capacitor Cbl is selected by design to program the bit line discharge rate.

The discharge time sensing circuit 122 also includes a timing control circuit 136 for controlling a duration of the timer on measurement period. The circuit 136 includes a comparator circuit 138 having an inverting input coupled to the read bit line RBL and a non-inverting input coupled to receive the threshold discharge voltage Vdis. The output of comparator circuit 138 (signal comp) transitions to logic high when the voltage Va,R on the read bit line RBL falls below the threshold discharge voltage Vdis. The signal comp output from the comparator 138 is applied to the set input (S) of a set/reset (S/R) flip flop 144 within the timing control circuit 136. A reset input (R) of the flip flop 144 is coupled to receive a logical complement (PCHB) of the precharge signal PCH. Thus, the complement data output (QB) of the flip flop 144 is set logic low in response to the assertion logic high of the signal at the set input (S). Conversely, the complement data output (QB) of the flip flop 144 is set logic high in response to the assertion logic high of the precharge signal PCH at the reset input (R).

The complement data output (QB) of the flip flop 144 is coupled to provide the discharge enable signal Dis_EN for controlling operation of the device N1 in the capacitor discharge circuit 132. Thus, device N1 is turned on in response to the complement data output (QB) of the flip flop 144 being set logic high (discharge enable signal Dis_EN being logic high), and is turned off in response to the complement data output (QB) of the flip flop 144 being set logic low (discharge enable signal Dis_EN being logic low). Prior to the in-memory computation operation, the precharge signal PCH is driven logic low and thus the logical complement PCHB is logic high which causes the reset of the flip flop 144 and the output of a logic high state for the discharge enable signal Dis_EN. At the start of the in-memory computation operation, the precharge signal PCH is driven logic high and thus the logical complement PCHB is logic low. The read word lines RWL are asserted and the read bit line RBL begins to discharge from the precharge voltage level Vpch dependent on the logic state of the weight data stored in the memory cells 114 and the width of the word line signal pulse. When the voltage on the read bit line RBL falls below the threshold discharge voltage Vdis, the output of the comparator 138 transitions to logic high. This logic high state is applied to the set input of the flip flop 144. In response thereto, the complement data output (QB) of the flip flop 144 transitions to logic low and the logic low state of the discharge enable signal Dis_EN disables the capacitor discharge circuit 132. As noted above, further discharge of the timing capacitor CT is then terminated. The remaining voltage on the timing capacitor CT is thus indicative of the amount of time taken to discharge the read bit line RBL from the precharge voltage Vpch to the threshold discharge voltage Vdis.

Figure 12:
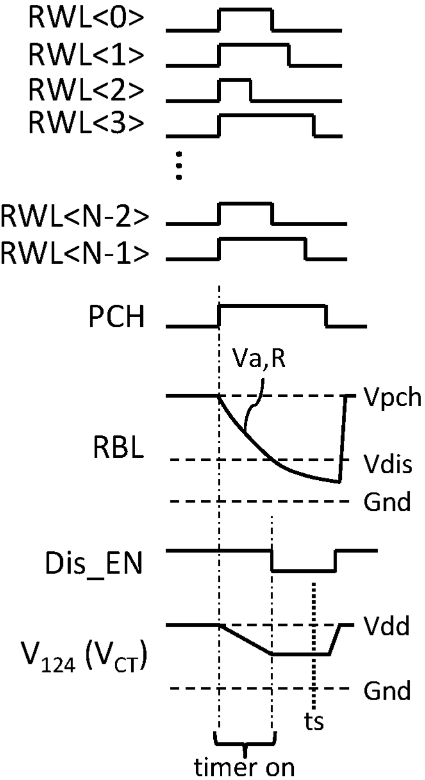
FIG. 12 illustrates a timing diagram for operation of the analog in-memory computation circuit of FIG. 6 using the discharge time sensing circuit of FIG. 11.

FIG. 12 illustrates a timing diagram for operation of the analog in-memory computation circuit 110 using the discharge time sensing circuit 122 of FIG. 11. Prior to the in-memory computation operation, the precharge signal PCH is driven logic low to turn on the p-channel MOSFET device and precharge the read bit line RBL to the precharge voltage Vpch level. The logic low precharge signal PCH further turns on device P1 and precharges the timing capacitor CT (reference $V_{124}$ ($V_{CT}$)) to the supply voltage Vdd level. The logical complement PCHB is logic high which causes the reset of the flip flop 144 and the output of a logic high state for the discharge enable signal Dis_EN.

At the start of the in-memory computation operation, the precharge signal PCH is driven logic high to turn off the p-channel MOSFET device in the precharge circuit 130 and turn off the device P1 in the capacitor charging circuit. The pulses of the word line signals are simultaneously applied to the read word lines RWL and the read bit line RBL begins to discharge from the precharge voltage Vpch at a rate dependent on the logic state of the weight bit stored in the memory cells 114 and the width of the applied word line signal pulses. The logic high state of the precharge signal PCH also turns on device N2 of the capacitor discharge circuit 132 to begin the timer on measurement period, and the sinking current Idis begins to discharge the voltage stored on the timing capacitor CT. When the read bit line voltage Va,R falls below the threshold discharge voltage Vdis, the comparator 138 output transitions to logic high and the flip flop 144 is set. The discharge enable signal Dis_EN transitions to logic low to terminate further discharge of the timing capacitor CT (ending the timer on measurement period).

At this point, the remaining voltage on the timing capacitor CT is available to be sampled by the ADC circuit at time ts. The in-memory computation operation then ends with the precharge signal PCH being driven logic low.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A circuit, comprising:

a memory array including memory cells arranged in a matrix with plural rows and plural columns, each row including a word line connected to the memory cells of the row, each column including a bit line connected to the memory cells of the column, and each memory cell storing a bit of weight data for an in-memory computation operation;

a word line driver circuit for each row having an output connected to drive the word line of the row;

a row controller circuit coupled to the word line driver circuits and configured to simultaneously actuate a plurality of word lines during said in-memory computation operation; and a column processing circuit including: a discharge time sensing circuit for each column that generates an analog signal indicative of a time taken during said in-memory computation operation to discharge the bit line from a precharge voltage to a threshold voltage; analog-to-digital conversion circuitry configured to convert the analog signals to digital signals; and computation circuitry configured to perform digital signal processing calculations on the digital signals and generate a decision output for the in-memory computation operation;

wherein the discharge time sensing circuit comprises:

a timing capacitor;

a capacitor charging circuit configured to charge the timing capacitor to a first voltage level prior to the in-memory computation operation;

a capacitor discharging circuit configured to apply a discharge current to the timing capacitor during the in-memory computation operation; and a timing control circuit configured to terminate application of the discharge current when the discharge of the bit line from the precharge voltage reaches the threshold voltage;

wherein the analog signal is a second voltage level remaining on the timing capacitor after termination of the discharge current application.

2. The circuit of claim 1, wherein the discharge time sensing circuit comprises a bit line clamping circuit configured, after termination of the discharge current application, to clamp the bit line to a clamping voltage.

3. The circuit of claim 2, wherein the clamping voltage is greater than the threshold voltage.

4. The circuit of claim 2, wherein the clamping voltage is greater than a voltage on bit line where there is a risk of an inadvertent bit flip of the weight data stored in the memory cell.

5. The circuit of claim 1, further comprising a bit line precharge circuit that is actuated before the in-memory computation operation to precharge the bit line to the precharge voltage and deactuated to trigger application of the discharge current to the timing capacitor during the in-memory computation operation.

6. The circuit of claim 1, wherein the capacitor charging circuit is actuated before the in-memory computation operation to charge the timing capacitor and deactuated to trigger application of the discharge current to the timing capacitor during the in-memory computation operation.

7. The circuit of claim 1, wherein the timing capacitor is a variable capacitance circuit and further comprising a control circuit configured to generate a control signal for setting a capacitance of the variable capacitance circuit for the timing capacitor.

8. The circuit of claim 1, wherein each memory cell comprises a 6T-type static random access memory (SRAM) cell and the bit line is one bit line of a complementary pair of bit lines for the SRAM cells.

9. The circuit of claim 1, wherein each memory cell comprises a 6T-type static random access memory (SRAM) cell and the bit line is both bit lines of a complementary pair of bit lines for the SRAM cells.

10. The circuit of claim 1, wherein each memory cell comprises an 8T-type static random access memory (SRAM) cell and the bit line is a read bit line for the SRAM cells.

11. The circuit of claim 1, wherein the memory cells are non-volatile memory (NVM) cells and the bit line is an NVM cell bit line.

12. The circuit of claim 1, wherein the row controller circuit simultaneously actuates the plurality of word lines in response to feature data for the in-memory computation operation.

13. The circuit of claim 1, further comprising:

a variable capacitance circuit coupled to each bit line; and a control circuit configured to generate a control signal for setting a capacitance of the variable capacitance circuit coupled to each bit line.

14. A circuit, comprising:

a memory array including memory cells arranged in a matrix with plural rows and plural columns, each row including a word line connected to the memory cells of the row, each column including a bit line connected to the memory cells of the column, and each memory cell storing a bit of weight data for an in-memory computation operation;

a word line driver circuit for each row having an output connected to drive the word line of the row;

a row controller circuit coupled to the word line driver circuits and configured to simultaneously actuate a plurality of word lines during said in-memory computation operation; and a column processing circuit including:

a discharge time sensing circuit for each column comprising:

a timing capacitor having a capacitor voltage that is selectively discharged by a discharge current during said in-memory computation operation; and a comparator circuit configured to control termination of the discharge current in response to a comparison of a bit line voltage to a threshold voltage;

a bit line clamping circuit configured to clamp the bit line to a clamp voltage following discharge of the bit line to the threshold voltage;

analog-to-digital conversion circuitry configured to convert the capacitor voltages to digital signals; and computation circuitry configured to perform digital signal processing calculations on the digital signals and generate a decision output for the in-memory computation operation.

15. The circuit of claim 14, wherein the clamping voltage is greater than the threshold voltage.

16. The circuit of claim 14, wherein the clamping voltage is greater than a voltage on bit line where there is a risk of an inadvertent bit flip of the weight data stored in the memory cell.

17. The circuit of claim 14, wherein each memory cell comprises a 6T-type static random access memory (SRAM) cell and the bit line is one bit line of a complementary pair of bit lines for the SRAM cells.

18. The circuit of claim 14, wherein each memory cell comprises a 6T-type static random access memory (SRAM) cell and the bit line is both bit lines of a complementary pair of bit lines for the SRAM cells.

19. The circuit of claim 14, wherein the memory cells are non-volatile memory (NVM) cells and the bit line is an NVM cell bit line.

20. The circuit of claim 14, wherein the row controller circuit simultaneously actuates the plurality of word lines in response to feature data for the in-memory computation operation.

21. The circuit of claim 14, wherein the discharge time sensing circuit further comprises:

a capacitor charging circuit configured to charge the timing capacitor to a first voltage level prior to the in-memory computation operation; and a capacitor discharging circuit configured to apply the discharge current to the timing capacitor during the in-memory computation operation to discharge the timing capacitor to a second voltage level after termination of the discharge current application.

22. The circuit of claim 21, wherein the timing capacitor is a variable capacitance circuit and further comprising a control circuit configured to generate a control signal for setting a capacitance of the variable capacitance circuit for the timing capacitor.

23. The circuit of claim 14, further comprising:

a variable capacitance circuit coupled to each bit line; and a control circuit configured to generate a control signal for setting a capacitance of the variable capacitance circuit coupled to each bit line.

24. A method, comprising:

storing bits of weight data for an in-memory computation operation in memory cells of a memory array including plural rows and plural columns, each row including a word line connected to the memory cells of the row, and each column including a bit line connected to the memory cells of the column;

simultaneously actuating a plurality of word lines during said in-memory computation operation;

generating an analog signal indicative of a time taken during said in-memory computation operation to discharge each bit line from a precharge voltage to a threshold voltage;

converting the analog signals to digital signals; and performing digital signal processing calculations on the digital signals to generate a decision output for the in-memory computation operation;

wherein generating the analog signal comprises:

charging a timing capacitor to a first voltage level prior to the in-memory computation operation;

applying a discharge current to the timing capacitor during the in-memory computation operation; and terminating application of the discharge current when the discharge of the bit line from the precharge voltage reaches the threshold voltage;

wherein the analog signal is a second voltage level remaining on the timing capacitor after termination of the discharge current application.

25. The method of claim 24, further comprising clamp the bit line to a clamping voltage after termination of the discharge current application.

26. The method of claim 25, wherein the clamping voltage is greater than the threshold voltage.

27. The method of claim 25, wherein the clamping voltage is greater than a voltage on bit line where there is a risk of an inadvertent bit flip of the weight data stored in the memory cell.

28. The method of claim 24, further comprising precharging the bit line to the precharge voltage before the in-memory computation operation and deactuating precharging to trigger application of the discharge current to the timing capacitor during the in-memory computation operation.

29. The method of claim 24, further comprising charging the timing capacitor before the in-memory computation operation and deactuating charging to trigger application of the discharge current to the timing capacitor during the in-memory computation operation.

30. The method of claim 24, wherein the timing capacitor is a variable capacitance circuit and further comprising setting a capacitance of the variable capacitance circuit for the timing capacitor.

31. The method of claim 24, wherein the simultaneously actuated plurality of word lines are selected in response to feature data for the in-memory computation operation.

32. The method of claim 24, where a variable capacitance circuit is coupled to each bit line, and further comprising setting a capacitance of the variable capacitance circuit coupled to each bit line.

* * * * *